United States Patent
Lee et al.

(10) Patent No.: US 11,271,024 B2
(45) Date of Patent: Mar. 8, 2022

(54) SEMICONDUCTOR DEVICE AND METHOD FOR FORMING THE SAME

(71) Applicant: Vanguard International Semiconductor Corporation, Hsinchu (TW)

(72) Inventors: Hsin-Hui Lee, Kaohsiung (TW); Han-Liang Tseng, Hsinchu (TW); Hsueh-Jung Lin, Jhubei (TW); Chin-Cheng Li, Changhua County (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 99 days.

(21) Appl. No.: 16/707,617

(22) Filed: Dec. 9, 2019

(65) Prior Publication Data

US 2021/0175271 A1 Jun. 10, 2021

(51) Int. Cl.
*H01L 27/146* (2006.01)
*G06K 9/00* (2006.01)

(52) U.S. Cl.
CPC .. *H01L 27/14627* (2013.01); *H01L 27/14623* (2013.01); *H01L 27/14685* (2013.01); *G06K 9/00013* (2013.01)

(58) Field of Classification Search
None
See application file for complete search history.

(56) References Cited

U.S. PATENT DOCUMENTS

| 7,061,028 | B2 * | 6/2006 | Yaung | H01L 27/14625 250/208.1 |
| 2004/0251395 | A1 * | 12/2004 | Takahashi | H01L 27/14656 250/208.1 |
| 2005/0045928 | A1 * | 3/2005 | Kuriyama | H01L 27/14629 257/294 |
| 2006/0163451 | A1 * | 7/2006 | Park | H01L 27/14685 250/208.1 |
| 2009/0009445 | A1 * | 1/2009 | Lee | G09F 9/372 345/85 |
| 2012/0200751 | A1 * | 8/2012 | Kato | H01L 27/1463 348/294 |
| 2012/0273907 | A1 * | 11/2012 | Lim | H01L 27/14621 257/432 |

(Continued)

FOREIGN PATENT DOCUMENTS

| TW | 201640095 A | 11/2016 |
| TW | I633493 B | 8/2018 |
| TW | M571523 U | 12/2018 |

OTHER PUBLICATIONS

Taiwanese Office Action and Search Report for Taiwanese Application No. 108130543, dated Feb. 14, 2020.

*Primary Examiner* — Khaja Ahmad
(74) *Attorney, Agent, or Firm* — Birch, Stewart, Kolasch & Birch, LLP

(57) ABSTRACT

A semiconductor device includes a substrate and a light collimator layer. The substrate has a plurality of pixels. The light collimator layer is disposed on the substrate. The light collimator layer includes a light shielding layer disposed on the substrate, a plurality of transparent pillars disposed in the light shielding layer, and a plurality of optical microlenses disposed on the pixels.

20 Claims, 16 Drawing Sheets

(56) References Cited

U.S. PATENT DOCUMENTS

| | | | |
|---|---|---|---|
| 2015/0008554 A1* | 1/2015 | Akiyama | H01L 27/14629 |
| | | | 257/432 |
| 2016/0071896 A1* | 3/2016 | Kawabata | H01L 27/14605 |
| | | | 348/294 |
| 2016/0293873 A1* | 10/2016 | Yamaguchi | H04N 5/374 |
| 2019/0131327 A1* | 5/2019 | Chou | H01L 27/1463 |

* cited by examiner

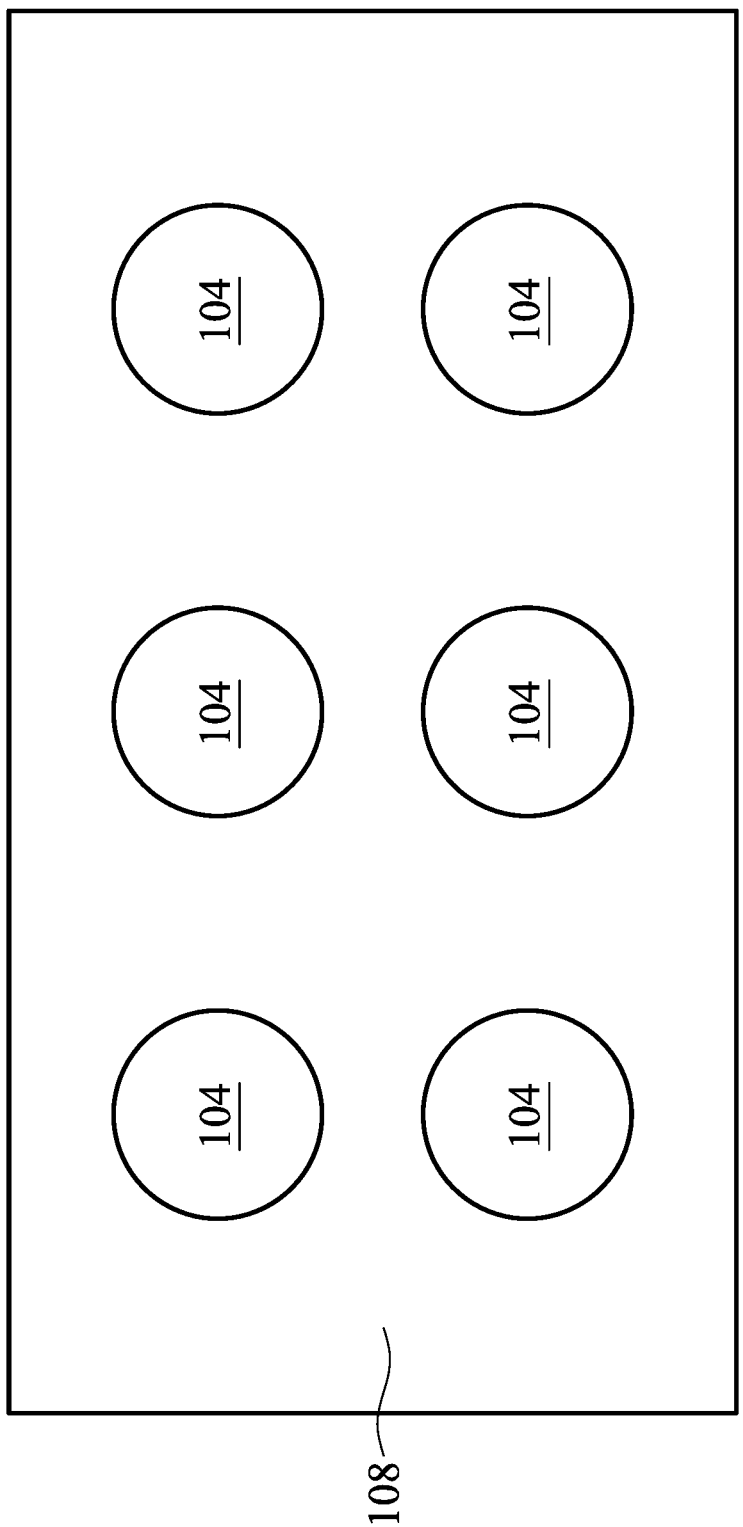

SEMICONDUCTOR DEVICE AND METHOD FOR FORMING THE SAME

BACKGROUND

Technical Field

The disclosure relates to a semiconductor device, and more particularly to semiconductor device including a light collimator layer and methods for forming the same.

Description of the Related Art

Semiconductor devices may be used in various applications. For example, a semiconductor device may be used as a fingerprint recognition device (or at least part of a fingerprint recognition device). The fingerprint recognition device may be composed of a large number of optical elements. The aforementioned optical elements may include a light collimator.

The function of the light collimator is to collimate a light beam to reduce energy loss caused by the divergence of the light beam. For example, the light collimator may be applied to the fingerprint recognition device to increase the performance of the fingerprint recognition device.

However, existing optical collimators and their formation methods are not entirely satisfactory in all respects.

SUMMARY

In one embodiment of the present disclosure, a semiconductor device is provided, wherein the semiconductor device includes a substrate and a light collimator layer. The substrate includes a plurality of pixels. The light collimator layer is disposed on the substrate. The light collimator layer includes a light shielding layer, a plurality of transparent pillars, and a plurality of optical microlenses. The light shielding layer is disposed on the substrate. The plurality of transparent pillars is disposed in the light shielding layer, wherein the transparent pillars cover the pixels. The plurality of optical microlenses are disposed on the pixels.

In one embodiment of the present disclosure, a method for forming a semiconductor device is provided, wherein the method includes: providing a substrate, wherein the substrate comprises a plurality of pixels; forming a plurality of transparent pillars on the pixels; forming a light shielding layer on the substrate, wherein the light shielding layer surrounds the transparent pillars; and forming a plurality of optical microlenses on the pixels.

BRIEF DESCRIPTION OF THE DRAWINGS

Aspects of this disclosure are best understood from the following detailed description when read with the accompanying figures. It should be noted that, in accordance with common practice in the industry, various features are not drawn to scale. In fact, the dimensions of the various features may be arbitrarily increased or reduced for clarity of discussion.

FIG. 1E' is a top view illustrating the step in the process of FIG. 1E according to some embodiments of the present disclosure.

DETAILED DESCRIPTION

Figure 1A:
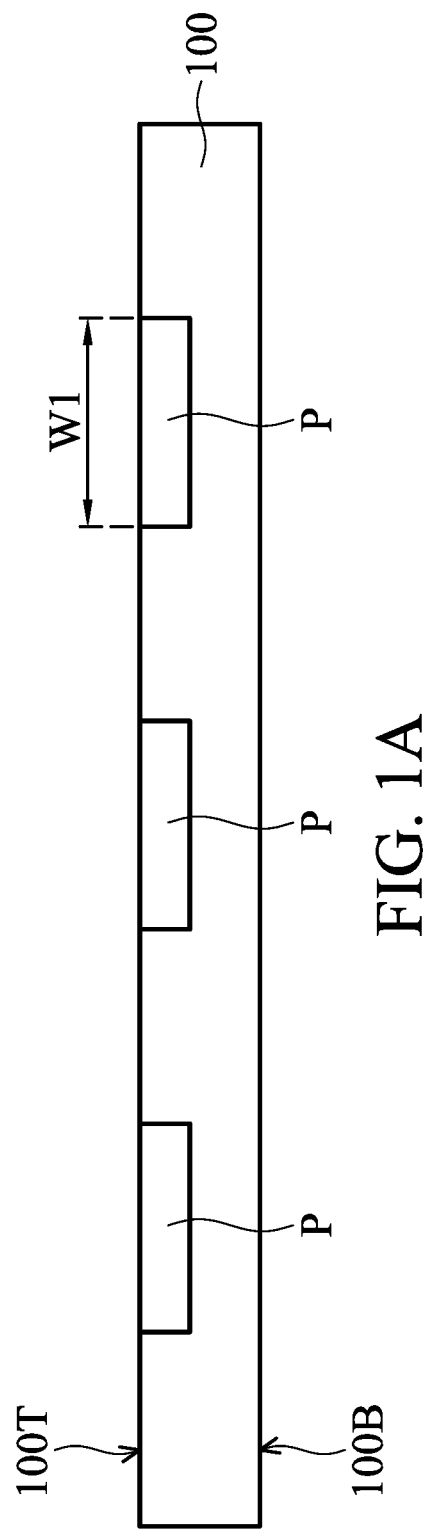
FIG. 1A, FIG. 1B, FIG. 1C, FIG. 1D, FIG. 1E, FIG. 1F, and FIG. 1G are cross-sectional views illustrating a method of forming a semiconductor device according to some embodiments of the present disclosure.

The following disclosure provides many different embodiments, or examples, for implementing different features of the subject matter provided. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features. In addition, the present disclosure may repeat reference numerals and/or letters in the various examples. This repetition is for the purpose of simplicity and clarity and does not in itself dictate a relationship between the various embodiments and/or configurations discussed.

It is understandable that additional operations may be performed before, during or after the method described, and that in other embodiments of the method, some of the operations may be substituted or omitted.

Furthermore, spatially relative terms, such as "over", "below," "lower," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented and the spatially relative descriptors used herein may likewise be interpreted accordingly.

Unless otherwise defined, all terms (including technical and scientific terms) used herein have the same meaning as commonly understood by one of ordinary skill in the art. It is understandable that these terms, such as the terms defined in the commonly used dictionary, should be interpreted as having the meaning consistent with the related art and the background or context of the present disclosure, and should not be interpreted in an idealized or overly formal way unless specifically defined in the embodiments of the disclosure.

Although some embodiments are discussed with steps performed in a particular order, these steps may be performed in another logical order. Additional features can be provided to the semiconductor structures in embodiments of the present disclosure. Some of the features described below can be replaced or eliminated for different embodiments.

The present disclosure provides embodiments of a semiconductor device, wherein a light collimator layer of the semiconductor device includes a plurality of optical microlenses. The optical microlenses may enhance the collimation performance of the light collimator layer. Moreover, in the embodiments of the present disclosure, since the optical microlenses are disposed in the light collimator layer, transparent pillars of the light collimator layer may have a smaller aspect ratio, thereby avoiding or alleviating the collapse of the transparent pillars.

Figure 1B:
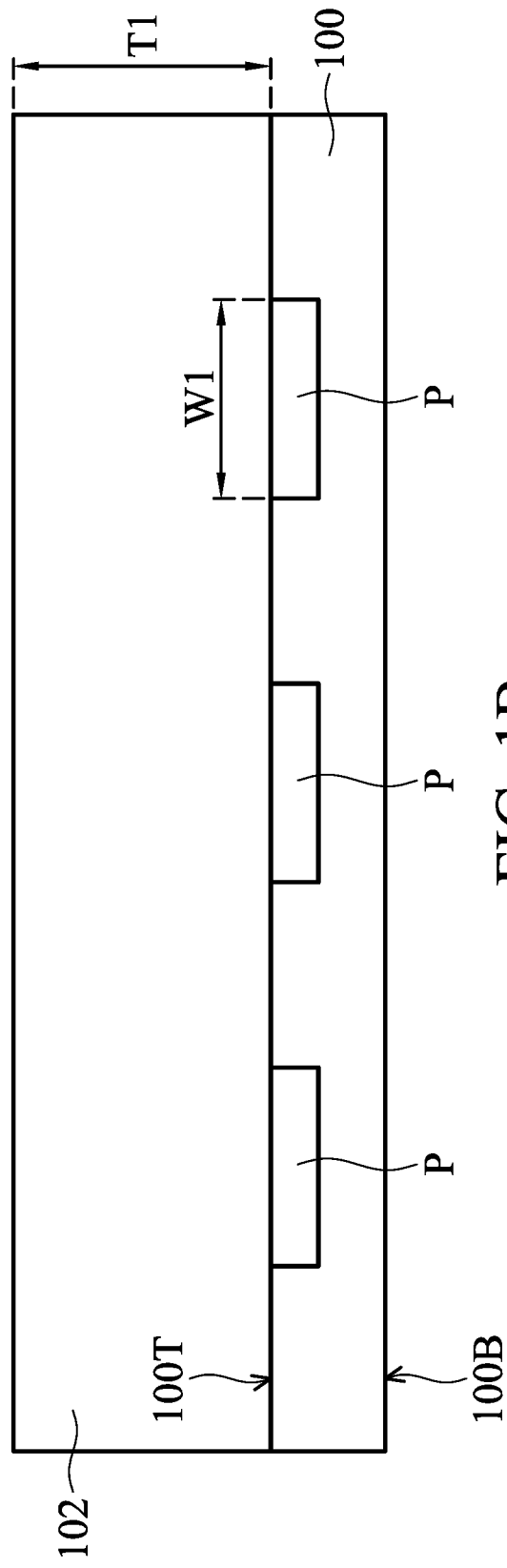
Figure 1C:
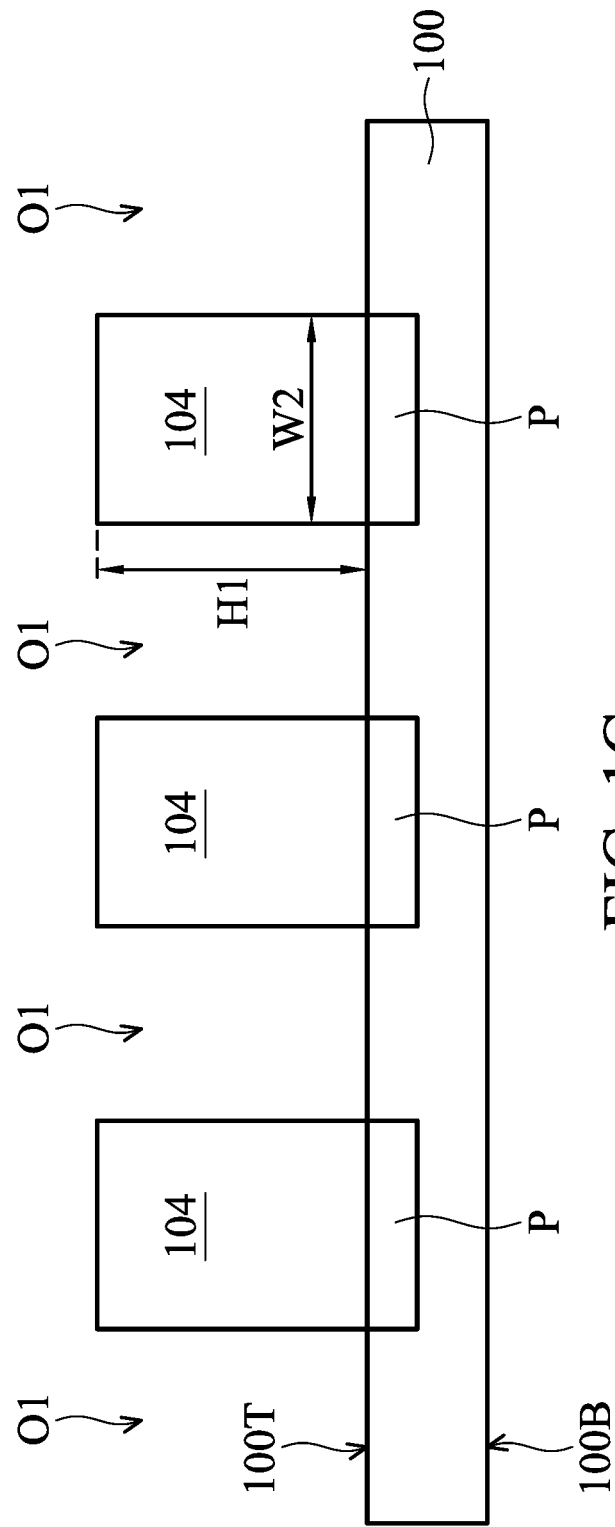
Figure 1D:
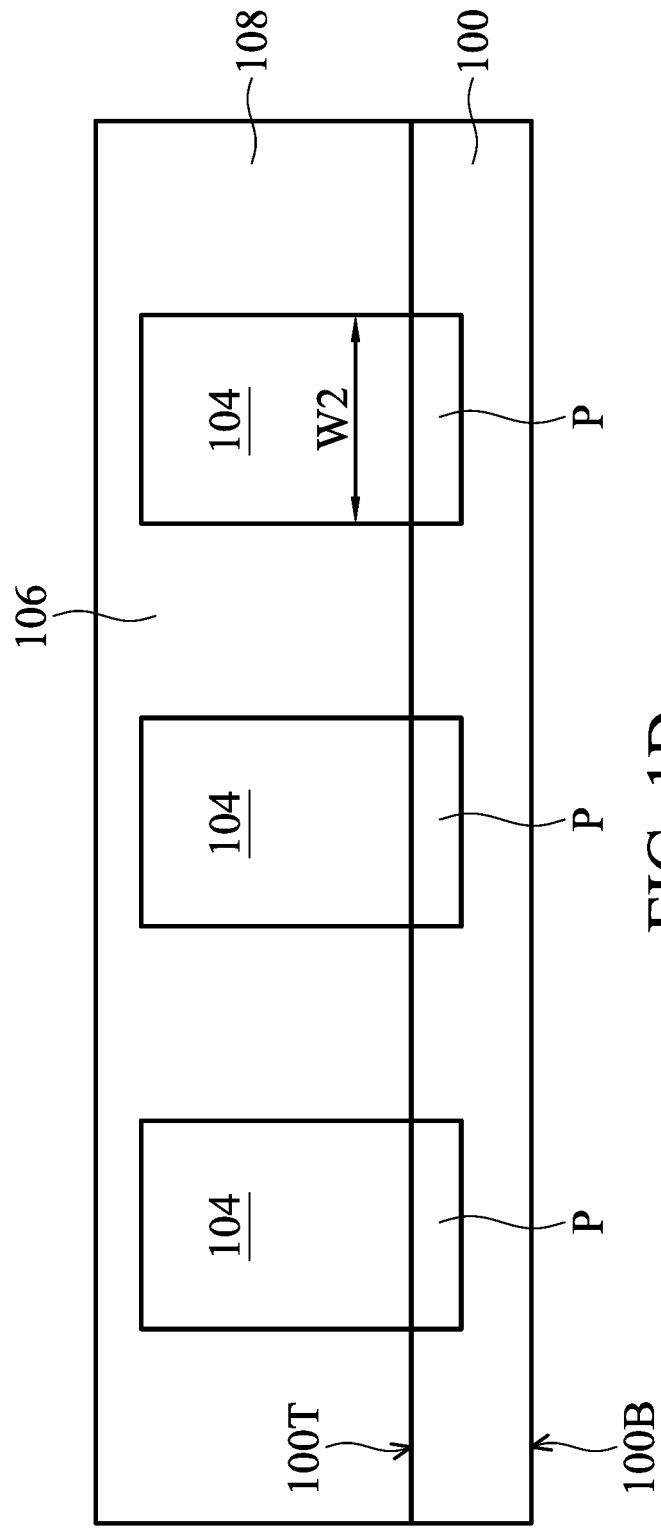
Figure 1E:
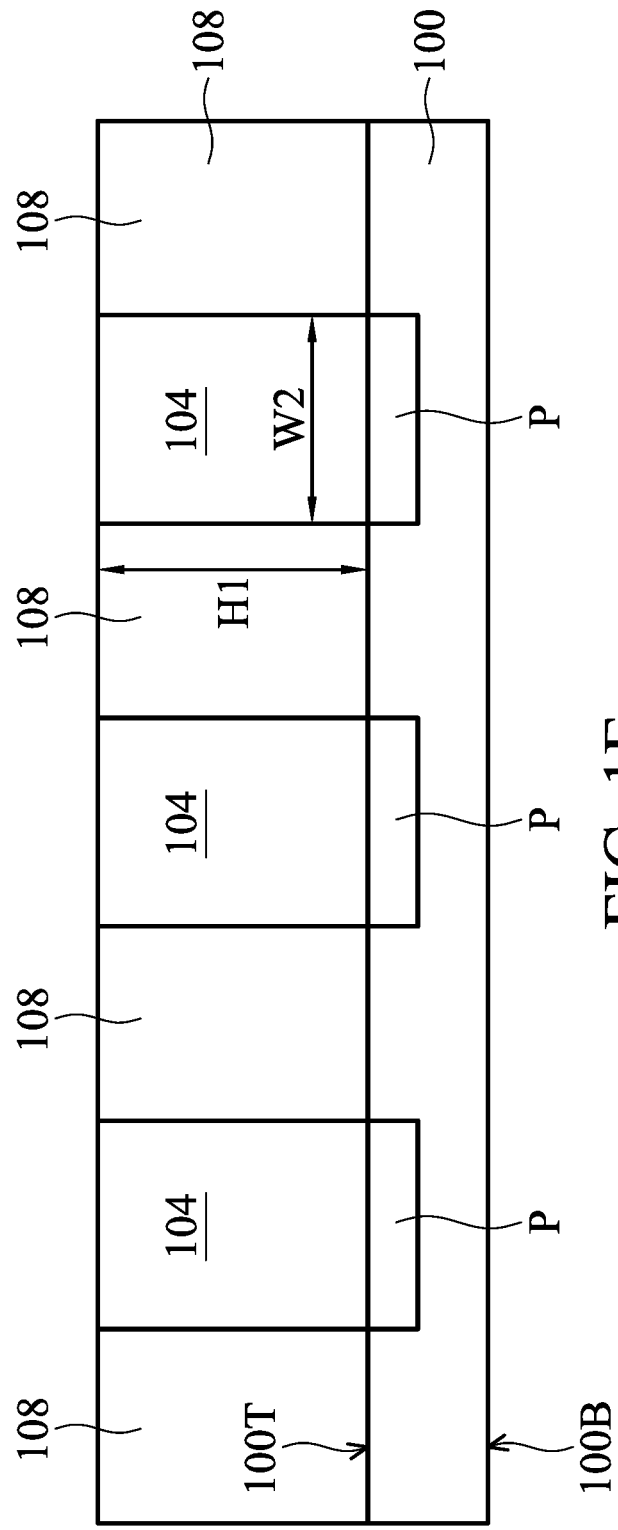

FIG. 1A, FIG. 1B, FIG. 1C, FIG. 1D, FIG. 1E, FIG. 1F, and FIG. 1G are cross-sectional views illustrating a method of forming a semiconductor device according to some embodiments of the present disclosure. FIG. 1E' is a top view illustrating the step in the process of FIG. 1E according to some embodiments of the present disclosure.

First, according to some embodiments, as shown in FIG. 1A, a substrate 100 is provided. The substrate 100 may have a top surface 100T and a bottom surface 100B opposite to the top surface 100T.

In some embodiments, the substrate 100 may be formed of an elemental semiconductor (e.g., silicon or germanium), a compound semiconductor (e.g., silicon carbide (SiC), gallium arsenide (GaAs), indium arsenide (InAs), or indium phosphide (InP)), an alloy semiconductor (e.g., SiGe, SiGeC, GaAsP, or GaInP), another suitable semiconductor, or a combination thereof. In some embodiments, the substrate 100 may be a semiconductor-on-insulator (SOI) substrate. The aforementioned semiconductor substrate on the insulating layer may include a bottom plate, a buried oxide layer disposed on the bottom plate, and a semiconductor layer disposed on the buried oxide layer. In some embodiments, the substrate 100 may be a semiconductor wafer (e.g., silicon wafer or other suitable semiconductor wafer).

In some embodiments, the substrate 100 may include various p-type doped regions and/or n-type doped regions formed by ion implantation and/or diffusion processes. For example, the aforementioned doped regions may be configured to form transistors, photodiodes, and/or light emitting diodes, but the disclosure is not limited thereto.

In some embodiments, the substrate 100 may include various isolation features to separate different device regions in the substrate 100. For example, the isolation features may include a shallow trench isolation (STI) feature, but the disclosure is not limited thereto. In some embodiments, the step of forming the shallow trench isolation feature may include etching a trench in the substrate 100 and filling the trench with an insulating material (e.g., silicon oxide, silicon nitride, or silicon oxynitride). The filled trench may have a multilayer structure (e.g., a thermal oxidized liner and silicon nitride filled in the trench). A chemical mechanical polishing (CMP) process may be performed to polish away excess insulating material and planarize the top surface of the isolation feature.

In some embodiments, the substrate 100 may include various conductive features (e.g., lines or vias). For example, the aforementioned conductive features may be formed of aluminum (Al), copper (Cu), tungsten (W), their respective alloys, another suitable electrically conductive material, or a combination thereof.

In some embodiments, as shown in FIG. 1A, the substrate 100 may include a plurality of pixels P. In some embodiments, the pixel P converts the optical signal received into an electrical current signal. In some embodiments, the plurality of pixels P of the substrate 100 may be arranged in an array, but the disclosure is not limited thereto.

In some embodiments, one pixel P of the substrate 100 includes or corresponds to at least one photodiode and/or other suitable elements. As shown in FIG. 1A, the pixel P may have a width W1. For example, the width W1 may be 5 to 50 micrometers, but the disclosure is not limited thereto.

Next, as shown in FIG. 1B, in accordance with some embodiments, a first material 102 is disposed on the top surface 100T of the substrate 100. In some embodiments, the first material 102 is a transparent material. For example, the first material 102 may be a transparent photoresist, a polyimide, an epoxy, another suitable material, or a combination thereof. In the subsequent process, the first material 102 may be used to form transparent pillars (for example, transparent pillars 104 described later), which will be described in detail later.

In some embodiments, the first material 102 may include a photocurable material, a thermoset material, or a combination thereof. For example, the first material 102 may be coated on the top surface 100T of the substrate 100 using the spin-on coating process, but the disclosure is not limited thereto. For example, a thickness T1 of the first material 102 may be 5 to 500 micrometers, but the disclosure is not limited thereto.

Next, as shown in FIG. 1C, the patterning process is performed to pattern the first material 102 to form a plurality of transparent pillars 104. In particular, the aforementioned patterning process removes a portion of the first material 102, and the remaining first material 102 on the top surface 100T of the substrate 100 forms the plurality of transparent pillars 104. In some embodiments, the aforementioned patterning process includes soft baking, mask aligning, exposure, post-exposure baking, developing, rinsing, drying, another suitable step, or a combination thereof.

In some embodiments, the transparent pillars 104 are disposed corresponding to the pixels P. In other words, in the embodiments, one transparent pillar 104 may completely cover or partially cover the corresponding pixel P. In some embodiments, the transparent pillars 104 covering the pixels P may protect the pixels P and alleviate or avoid the damage and/or contamination of the pixels P during the fabrication processes. In some embodiments, the transparent pillars 104 are arranged in an array, but the disclosure is not limited thereto.

In some embodiments, as shown in FIG. 1C, the transparent pillar 104 may have a height H1 and a substantially uniform width W2. For example, the width W2 may be 5 micrometers to 50 micrometers, the height H1 may be 5 micrometers to 500 micrometers, but the disclosure is not limited thereto.

In some embodiments, as shown in FIG. 1C, the width W2 of the transparent pillar 104 may be substantially the same as the width W1 of the pixel P. In one embodiment, the sidewalls of the transparent pillar 104 may be aligned with the sidewalls of the corresponding pixel P. In some embodiments, the width W2 of the transparent pillar 104 is greater than the width W1 of the pixel P. In some embodiments, the width W2 of the transparent pillar 104 is smaller than the width W1 of the pixel P.

In some embodiments, as shown in FIG. 1C, a plurality of openings O1 exposing the substrate 100 are formed on the substrate 100 by the patterning process. In the subsequent process, the openings O1 are filled with a suitable light shielding material to form a light shielding layer of a light collimator layer of the embodiment of the present disclosure, which will be described later in detail.

Next, as shown in FIG. 1D, in some embodiments, a light shielding material 106 is disposed on the top surface 100T of the substrate 100. In some embodiments, the light shielding material 106 may fill the openings O1 and cover the transparent pillars 104.

For example, the light shielding material 106 may include a photoresist (e.g., a black photoresist or other suitable non-transparent photoresists), an ink (e.g., black ink or other suitable non-transparent inks), a molding compound (e.g., a black molding compound or other suitable non-transparent molding compounds), a solder mask (e.g., a black solder mask or other suitable non-transparent solder masks), an epoxy, another suitable material, or a combination thereof. In some embodiments, the light shielding material 106 may be a photocurable material, a thermoset material, or a combination thereof.

Next, according to some embodiments, as shown in FIG. 1E, a curing process may be performed on the light shielding material 106 to form a light shielding layer 108. For example, the aforementioned curing process may be a photocuring process, a thermal curing process, or a combination thereof.

Next, according to some embodiments, as shown in FIG. 1E, a planarization process is performed to remove the top of the light shielding layer 108 to expose the top surface of the transparent pillars 104. In some embodiments, the aforementioned planarization process also removes a portion of the transparent pillars 104 (for example, the top of the transparent pillar 104). For example, the planarization process may be a chemical-mechanical polishing process, a grinding process, an etch back process, another suitable process, or a combination thereof.

In some embodiments, after the aforementioned planarization process, the top surface of the light shielding layer 108 and the top surfaces of the transparent pillars 104 are level with each other. In some embodiments, after the aforementioned planarization process, the top surface of the light shielding layer 108 is coplanar with the top surfaces of the transparent pillars 104. In some embodiments, after the aforementioned planarization process, the light shielding layer 108 does not cover or only partially covers the pixels P.

In some embodiments, as shown in FIG. 1E and FIG. 1E', the light shielding layer 108 surrounds the transparent pillars 104. In some embodiments, the transparent pillars 104 are located within the light shielding layer 108. In some embodiments, as shown in FIG. 1E', the transparent pillars 104 have round top surfaces. In some embodiments, the top surface of the transparent pillar 104 is elliptical, oblong, rectangular, hexagonal, irregular, another suitable shape, or a combination thereof.

Figure 1F:
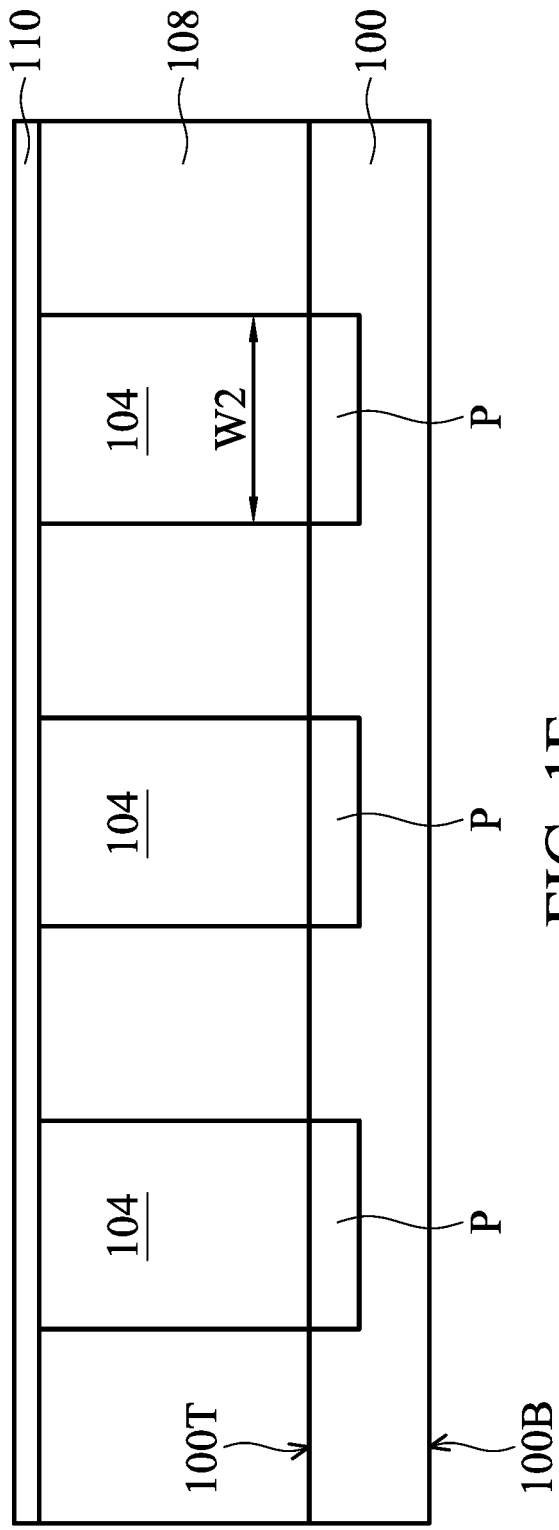

Next, according to some embodiments, as shown in FIG. 1F, an adhesive layer 110 is formed on the transparent pillars 104 and the light shielding layer 108. The adhesive layer 110 may be used to bond the transparent pillars 104 and optical microlenses (for example, optical microlenses 112 described later) formed on the transparent pillars 104.

In some embodiments, the adhesive layer 110 is formed of a transparent material. In some embodiments, the adhesive layer 110 is an optical cement. For example, the optical cement may be formed of a silicone, an acrylic resin, a polyurethane, an epoxy, another suitable material, or a combination thereof.

In some embodiments, the adhesive layer 110 can be attached to the transparent pillars 104 and the light shielding layer 108 using edge lamination, full lamination, another suitable technique, or a combination thereof.

Figure 1G:
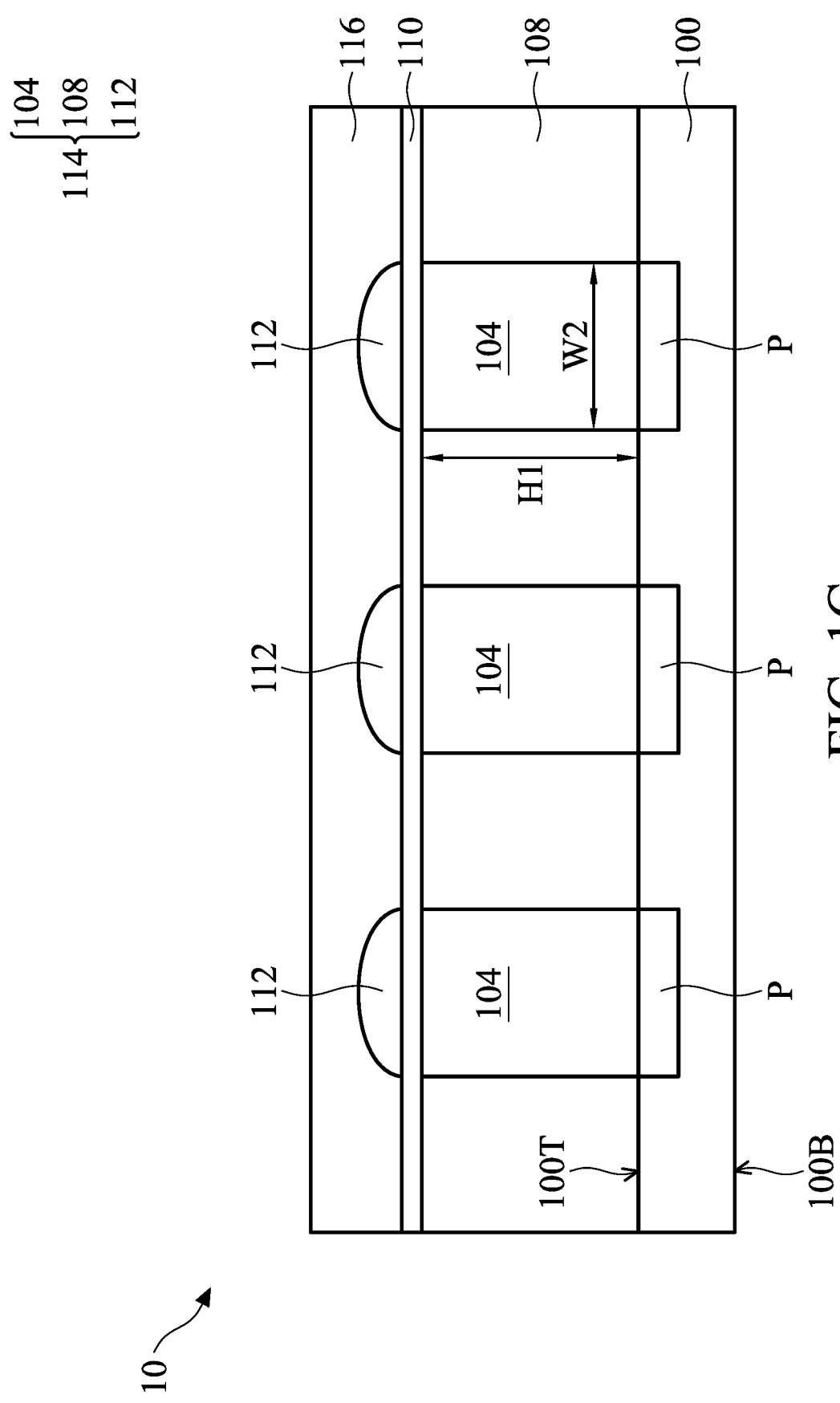

Next, according to some embodiments, as shown in FIG. 1G, a plurality of optical microlenses 112 are formed on the transparent pillars 104 to form the semiconductor device 10. In some embodiments, the optical microlenses 112 are arranged in an array, but the disclosure is not limited thereto.

The optical microlens 112 may be a plano-convex lens or a convex lens. In some embodiments, as shown in FIG. 1G, the optical microlens 112 has a curved top surface and a substantially flat bottom surface, but the disclosure is not limited thereto. In some embodiments, the optical microlens 112 has a curved top surface and a curved bottom surface.

In some embodiments, the optical microlenses 112 are formed of a transparent material. For example, the optical microlenses 112 may be formed of glass, epoxy, silicone, polyurethane, another suitable material, or a combination thereof.

For example, the optical microlenses 112 may be formed by a photoresist reflow method, a hot embossing method, another suitable method, or a combination thereof. In some embodiments, the step of forming the optical microlenses 112 may include a spin coating process, a lithography process, an etching process, another suitable process, or a combination thereof.

In some embodiments, the optical microlenses 112, the transparent pillars 104, and the light shielding layer 108 collectively form a light collimator layer 114 of the semiconductor device 10. In some embodiments, the optical microlens 112 has the function of focusing incident light, thereby enhancing the collimation performance of the light collimator layer 114.

In some embodiments, the optical microlenses 112 and the transparent pillars 104 are formed of different materials, and the refractive index of the optical microlenses 112 is greater than the refractive index of the transparent pillars 104, so that the optical microlenses 112 may have a good function of focusing incident light. For example, the refractive index of the optical microlenses 112 may be 1.2 to 1.8, and the refractive index of the transparent pillars 104 may be 1.0 to 1.5.

In some embodiments, since the optical microlenses 112 may enhance the collimation performance of the light collimator layer 114, the transparent pillars 104 of the light collimator layer 114 may have a smaller aspect ratio (for example, the ratio of height H1 to width W2 of the transparent pillar 104 (i.e., H1/W2) is 5:1 to 1:2), thereby avoiding or alleviating the collapse of the transparent pillars 104.

In some embodiments, the light shielding layer 108 of the light collimator layer 114 is black (for example, the light shielding layer 108 is formed of black photoresist, black ink, black molding compound or black solder mask), thereby enhancing the collimation performance of the light collimator layer 114.

In some embodiments, as shown in FIG. 1G, a proper encapsulating process may be performed depending on the actual situation to form an encapsulation layer 116 on the optical microlenses 112. The encapsulation layer 116 may provide physical protection for the optical microlenses 112 and prevent or alleviate moisture damage to the optical microlenses 112. For example, the encapsulation layer 116 may be formed of an epoxy, another suitable encapsulating material, or a combination thereof.

It should be understood that although not shown in the figures, in some embodiments, a light source (e.g., a light emitting diode), a barrier layer, another suitable optical element, or a combination thereof may be disposed on the light collimator layer 114, and a cover plate (e.g., a glass cover plate) may be disposed on the optical elements to form a semiconductor device such as a fingerprint recognition device.

In summary, the light collimator layer 114 of the semiconductor device 10 of the embodiment of the present disclosure includes the plurality of optical microlenses 112. The optical microlenses 112 may enhance the collimation performance of the light collimator layer 114. Moreover, in some embodiments, since the optical microlenses 112 are disposed in the light collimator layer 114, the transparent pillars 104 of the light collimator layer 114 may have a smaller aspect ratio, thereby avoiding or alleviating the collapse of the transparent pillars 104.

Figure 2:
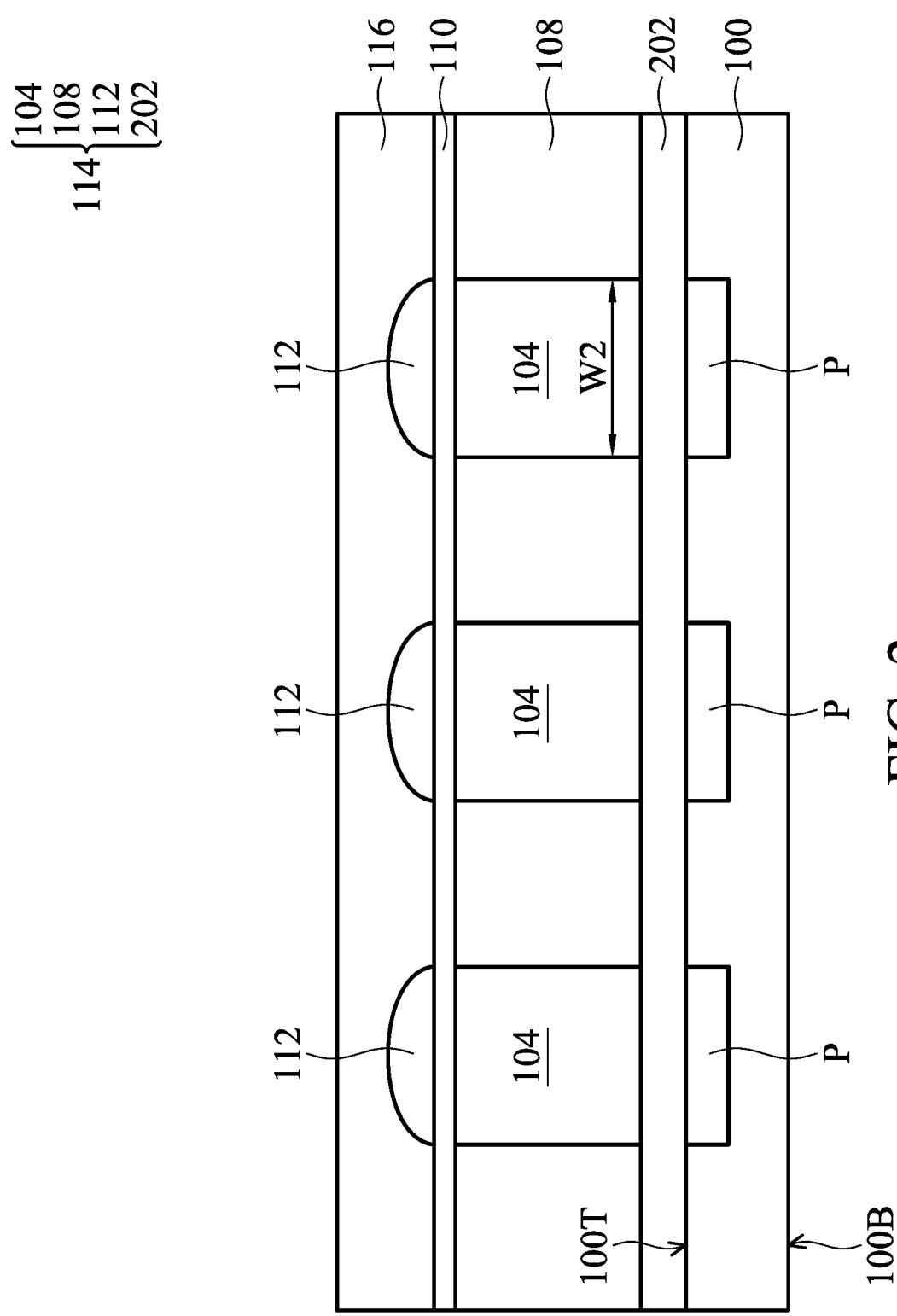
FIG. 2 is a cross-sectional diagram illustrating a semiconductor device according to some embodiments of the present disclosure.

FIG. 2 is a cross-sectional diagram illustrating a semiconductor device 20 according to some embodiments of the present disclosure. A difference between the semiconductor device 20 and the semiconductor device 10 is that the light collimator layer 114 of the semiconductor device 20 further includes a transparent material layer 202 disposed between the substrate 100 and the transparent pillars 104. In some embodiments, the transparent material layer 202 is first formed on the substrate 100, and then the transparent pillars 104 are formed on the transparent material layer 202.

In some embodiments, the transparent material layer 202 and the transparent pillars 104 are formed of the same material, such that the transparent pillars 104 are less likely to fall off of the transparent material layer 202. For example, the transparent material layer 202 may be formed of a transparent photoresist, a polyimide, an epoxy, another suitable transparent material, or a combination thereof. In some embodiments, the transparent material layer 202 is formed of a photocurable material, a thermoset material, or a combination thereof. For example, the step of forming the transparent material layer 202 may include a spin coating process, a curing process (e.g., a photocuring process, a thermal curing process, or a combination thereof), another suitable process, or a combination thereof.

Figure 3:
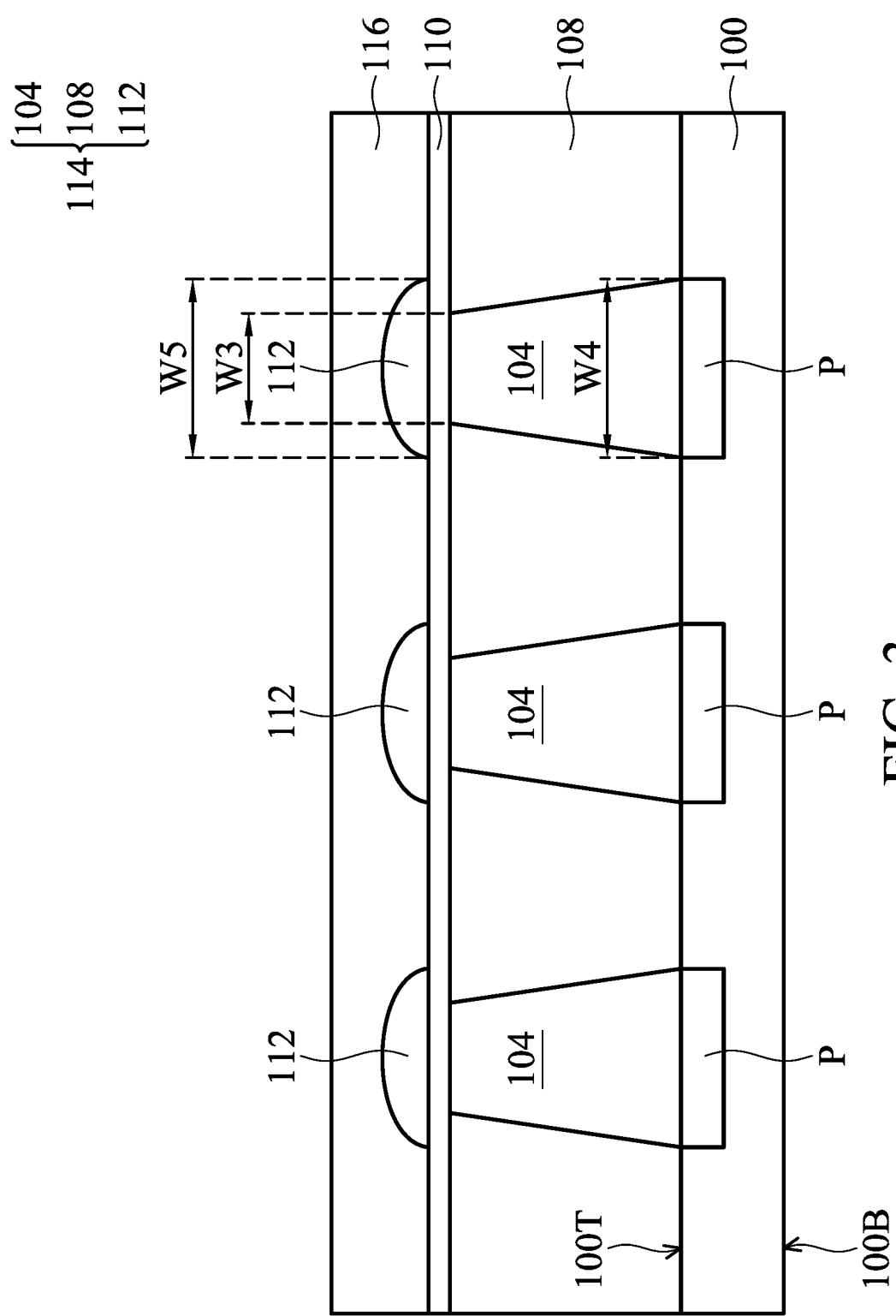
FIG. 3 is a cross-sectional diagram illustrating a semiconductor device according to some embodiments of the present disclosure.

FIG. 3 is a cross-sectional diagram illustrating a semiconductor device 30 according to some embodiments of the present disclosure. A difference between the semiconductor device 30 and the semiconductor device 10 is that a top width W3 of the transparent pillar 104 of the light collimator layer 114 of the semiconductor device 30 is smaller than a bottom width W4, and the collapse of the transparent pillar 104 may be alleviated or avoided. In some embodiments, as shown in FIG. 3, the top width W3 of the transparent pillar 104 is smaller than a bottom width W5 of the optical microlens 112.

Figure 4:
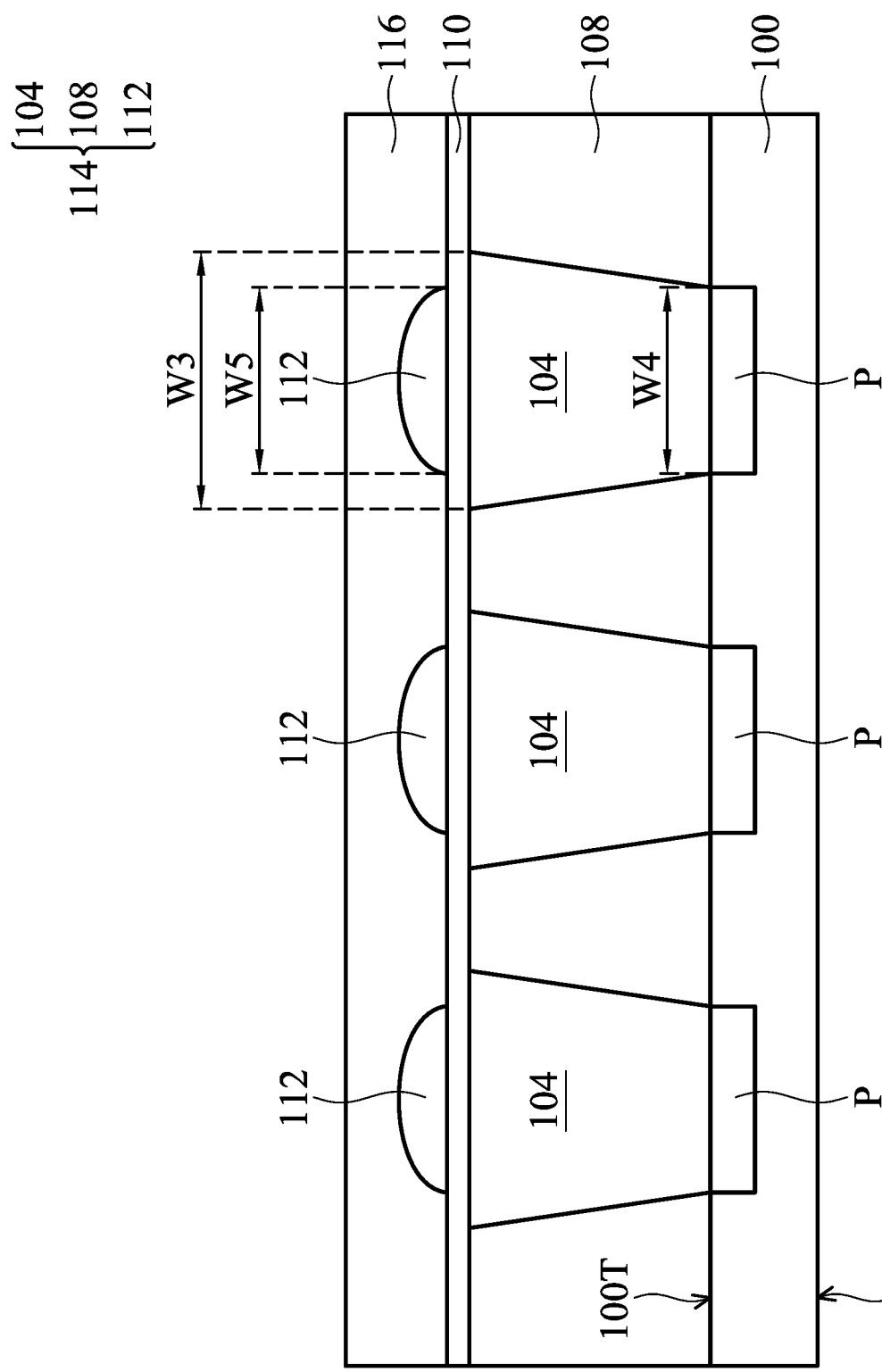
FIG. 4 is a cross-sectional diagram illustrating a semiconductor device according to some embodiments of the present disclosure.

FIG. 4 is a cross-sectional diagram illustrating a semiconductor device 40 according to some embodiments of the present disclosure. A difference between the semiconductor device 40 and the semiconductor device 10 is that the top width W3 of the transparent pillar 104 of the light collimator layer 114 of the semiconductor device 40 is greater than the bottom width W4. In some embodiments, as shown in FIG. 4, the top width W3 of the transparent pillar 104 is greater than the bottom width W5 of the optical microlens 112.

Figure 5A:
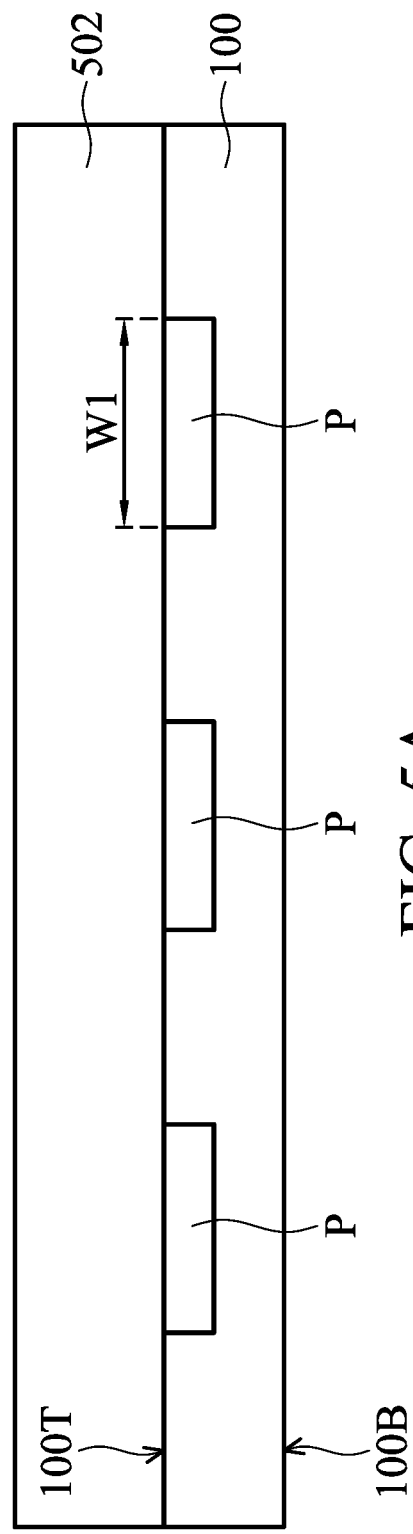
FIG. 5A, FIG. 5B, and FIG. 5C are cross-sectional views illustrating a method of forming a semiconductor device according to some embodiments of the present disclosure.
Figure 5B:
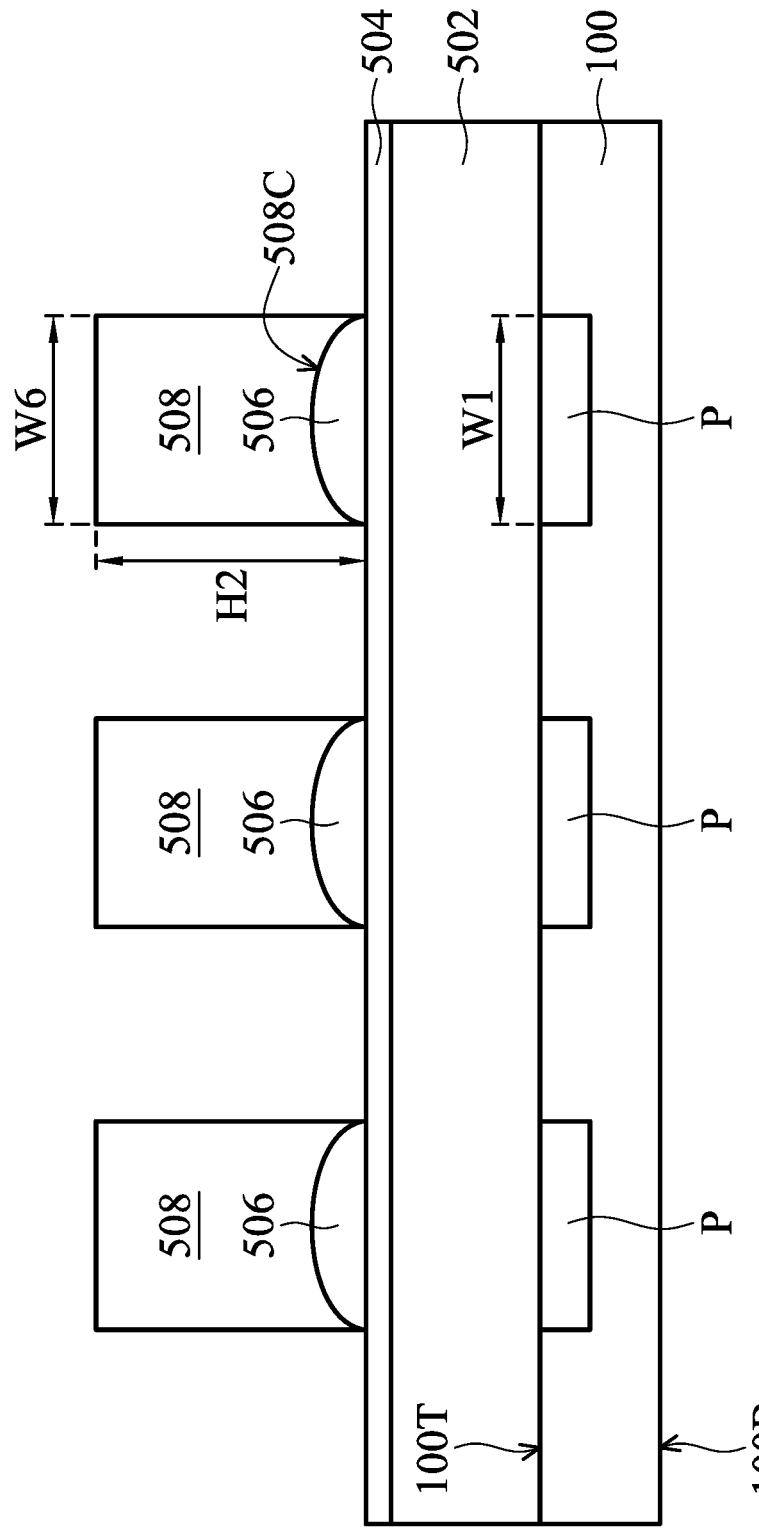
Figure 5C:
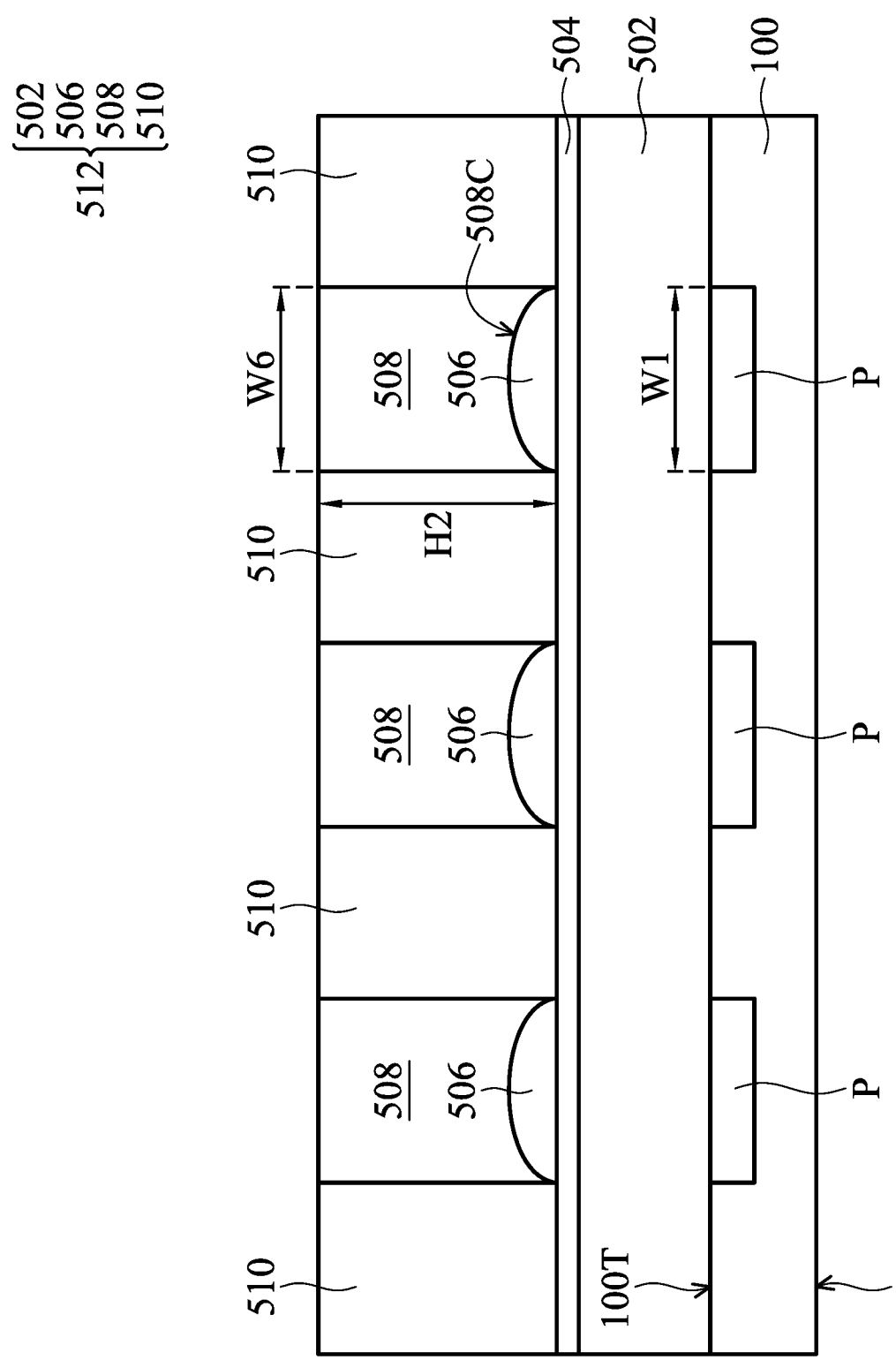

FIG. 5A, FIG. 5B, and FIG. 5C are cross-sectional views illustrating a method of forming a semiconductor device according to some embodiments of the present disclosure.

First, according to some embodiments, as shown in FIG. 5A, a substrate 100 is provided. Next, according to some embodiments, as shown in FIG. 5A, a transparent material layer 502 is formed on the top surface 100T of the substrate 100. For example, the transparent material layer 502 may be formed of a transparent photoresist, a polyimide, an epoxy, another suitable transparent material, or a combination thereof. In some embodiments, the transparent material layer 502 is formed of a photocurable material, a thermoset material, or a combination thereof. For example, the step of forming the transparent material layer 502 may include a spin coating process, a curing process (e.g., a photocuring process, a thermal curing process, or a combination thereof), another suitable process, or a combination thereof.

Next, according to some embodiments, as shown in FIG. 5B, an adhesive layer 504 is formed on the transparent material layer 502. The adhesive layer 504 may be used to bond the transparent material layer 502 and optical microlenses formed on the transparent material layer 502 (for example, optical microlenses 506 described later). The material and forming method of the adhesive layer 504 may be the same or similar to the material and forming method of the adhesive layer 110 of the aforementioned embodiment, which will not be described in detail for the sake of brevity.

Next, in accordance with some embodiments, as shown in FIG. 5B, a plurality of optical microlenses 506 are formed on the adhesive layer 504. In some embodiments, the optical microlenses 506 are disposed corresponding to the pixels P. In other words, in the embodiments, one optical microlens 506 may completely cover or partially cover the corresponding pixel P. In some embodiments, the optical microlenses 506 are arranged in an array, but the disclosure is not limited thereto.

The optical microlens 506 may be a plano-convex lens or a convex lens. In some embodiments, as shown in FIG. 5B, the optical microlens 506 has a curved top surface and a substantially flat bottom surface, but the disclosure is not limited thereto. In some embodiments, the optical microlens 506 has a curved top surface and a curved bottom surface. The material and forming method of the optical microlens 506 may be the same or similar to the material and forming method of the optical microlens 112 of the aforementioned embodiment, which will not be described in detail for the sake of brevity.

Next, in accordance with some embodiments, as shown in FIG. 5B, a plurality of transparent pillars 508 are formed on the optical microlenses 506. In some embodiments, the transparent pillars 508 are disposed corresponding to the optical microlenses 506. In other words, in the embodiments, one transparent pillar 508 may completely cover or partially cover the corresponding optical microlens 506. In some embodiments, the transparent pillars 508 are arranged in an array, but the disclosure is not limited thereto.

The material and forming method of the transparent pillars 508 may be the same or similar to the material and forming method of the transparent pillars 104 of the aforementioned embodiment, which will not be described in detail for the sake of brevity. In some embodiments, the transparent pillars 508 and the transparent material layer 502 are formed of the same material.

In some embodiments, as shown in FIG. 5B, the transparent pillars 508 have concave bottom profiles 508C. In some embodiments, the transparent pillars 508 have concave bottom profiles 508C, and the bottom surfaces of the transparent pillars 508 are in direct contact with the top surfaces of the optical microlenses 506, thereby avoiding or alleviating the collapse of the transparent pillars 508.

In some embodiments, as shown in FIG. 5B, the transparent pillar 508 may have a height H2 and a substantially uniform width W6. For example, the width W6 may be 5 micrometers to 50 micrometers, the height H2 may be 5 micrometers to 500 micrometers, but the disclosure is not limited thereto.

In some embodiments, as shown in FIG. 5B, the width W6 of the transparent pillar 508 may be substantially the same as the width W1 of the pixel P. In one embodiment, the sidewalls of the transparent pillar 508 may be aligned with the sidewalls of the corresponding pixel P. In some embodiments, the width W6 of the transparent pillar 508 is greater than the width W1 of the pixel P. In some embodiments, the width W6 of the transparent pillar 508 is smaller than the width W1 of the pixel P.

Next, according to some embodiments, as shown in FIG. 5C, a light shielding layer 510 is formed on the transparent material layer 502. In some embodiments, the light shielding layer 510 surrounds the transparent pillars 508. In some embodiments, the transparent pillars 508 and the optical microlenses 506 are located within the light shielding layer 510.

The material and forming method of the light shielding layer 510 may be the same or similar to the material and forming method of the light shielding layer 108 of the aforementioned embodiment, which will not be described in detail for the sake of brevity.

In some embodiments, the transparent material layer 502, the optical microlenses 506, the transparent pillars 508, and the light shielding layer 510 collectively form a light collimator layer 512 of the semiconductor device 50. In some embodiments, the optical microlens 506 has the function of focusing incident light, thereby enhancing the collimation performance of the light collimator layer 512.

In some embodiments, the material of the optical microlenses 506 is different from the material of the transparent pillars 508 and the material of the transparent material layer 502, and the refractive index of the optical microlenses 506 is greater than the refractive index of the transparent pillars 508 and the refractive index of the transparent material layer 502, so that the optical microlenses 506 may function well at focusing incident light. For example, the refractive index of the optical microlenses 506 may be 1.2 to 1.8, the refractive index of the transparent pillars 508 may be 1.0 to 1.5, and the refractive index of the transparent material layer 502 may be 1.0 to 1.5.

In some embodiments, since the optical microlenses 506 may enhance the collimation performance of the light collimator layer 512, the transparent pillars 508 of the light collimator layer 512 may have a smaller aspect ratio (for example, the ratio of height H2 to width W6 of the transparent pillar 508 (i.e., H2/W6) is 5:1 to 1:2), thereby avoiding or alleviating the collapse of the transparent pillars 508.

In some embodiments, the light shielding layer 510 of the light collimator layer 512 is black (for example, the light shielding layer 510 is formed of black photoresist, black ink, black molding compound or black solder mask), thereby enhancing the collimation performance of the light collimator layer 512.

In some embodiments, a proper encapsulating process may be performed depending on the actual situation to form an encapsulation layer (not shown) similar to the encapsulation layer 116 of the previous embodiment on the light collimator layer 512.

It should be understood that although not shown in the figures, in some embodiments, a light source (e.g., a light emitting diode), a barrier layer, another suitable optical element, or a combination thereof may be disposed on the light collimator layer 512, and a cover plate (e.g., a glass cover plate) may be disposed on the optical elements to form a semiconductor device such as a fingerprint recognition device.

In summary, the light collimator layer 512 of the semiconductor device 50 of the embodiment of the present disclosure includes the plurality of optical microlenses 506. The optical microlenses 506 may enhance the collimation performance of the light collimator layer 512. Moreover, in some embodiments, since the optical microlenses 506 are disposed in the light collimator layer 512, the transparent pillars 508 of the light collimator layer 512 may have a smaller aspect ratio, thereby avoiding or alleviating the collapse of the transparent pillars 508.

Figure 6:
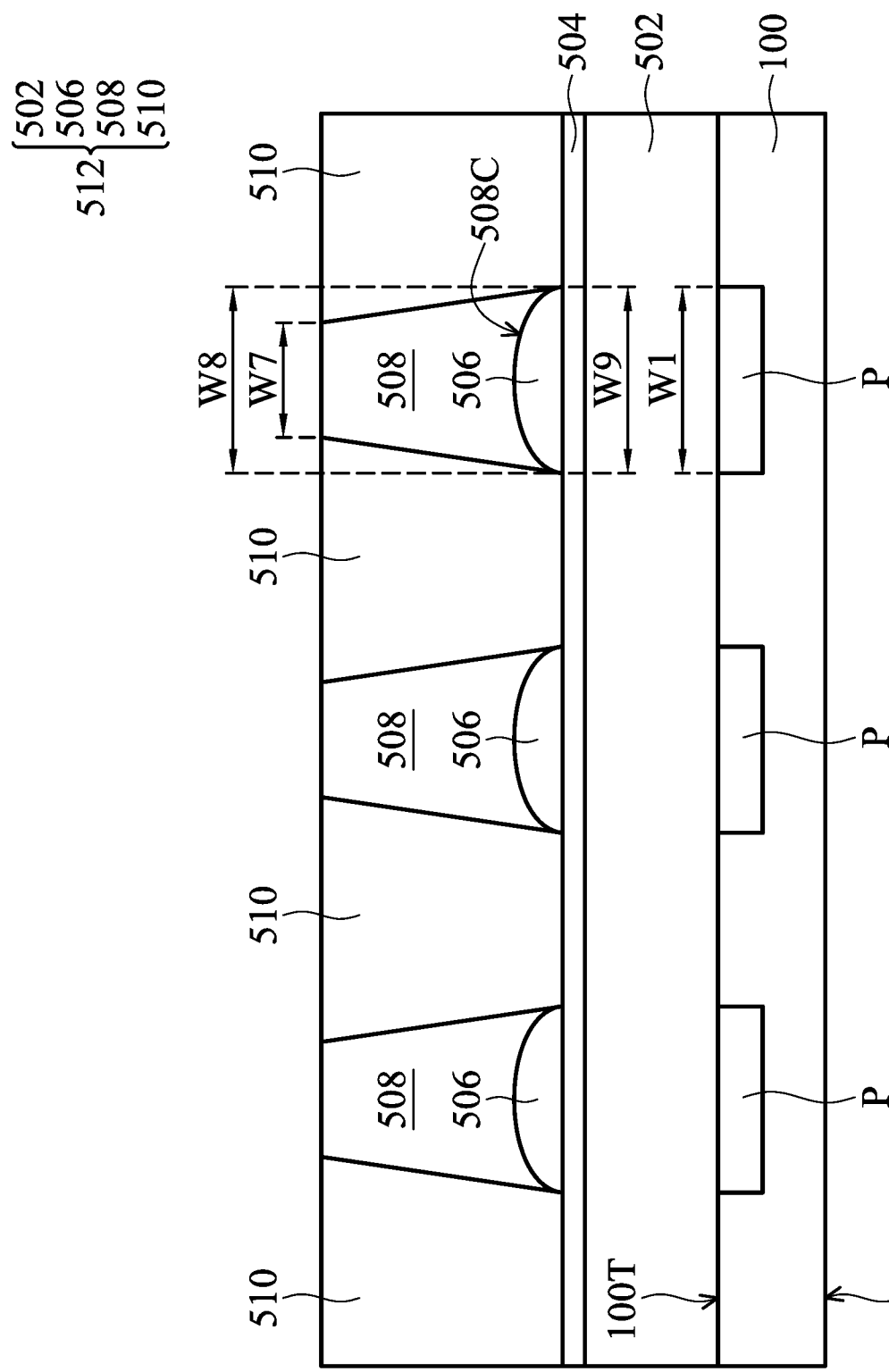
FIG. 6 is a cross-sectional diagram illustrating a semiconductor device according to some embodiments of the present disclosure.

FIG. 6 is a cross-sectional diagram illustrating a semiconductor device 60 according to some embodiments of the present disclosure. A difference between the semiconductor device 60 and the semiconductor device 50 is that a top width W7 of the transparent pillar 508 of the light collimator layer 512 of the semiconductor device 60 is smaller than a bottom width W8, thereby alleviating or avoiding the collapse of the transparent pillars 508. In some embodiments, as shown in FIG. 6, the top width W7 of the transparent pillar 508 is smaller than a bottom width W9 of the optical microlens 506, and the bottom width W8 of the transparent pillar 508 is substantially equal to the bottom width W9 of the optical microlens 506.

Figure 7:
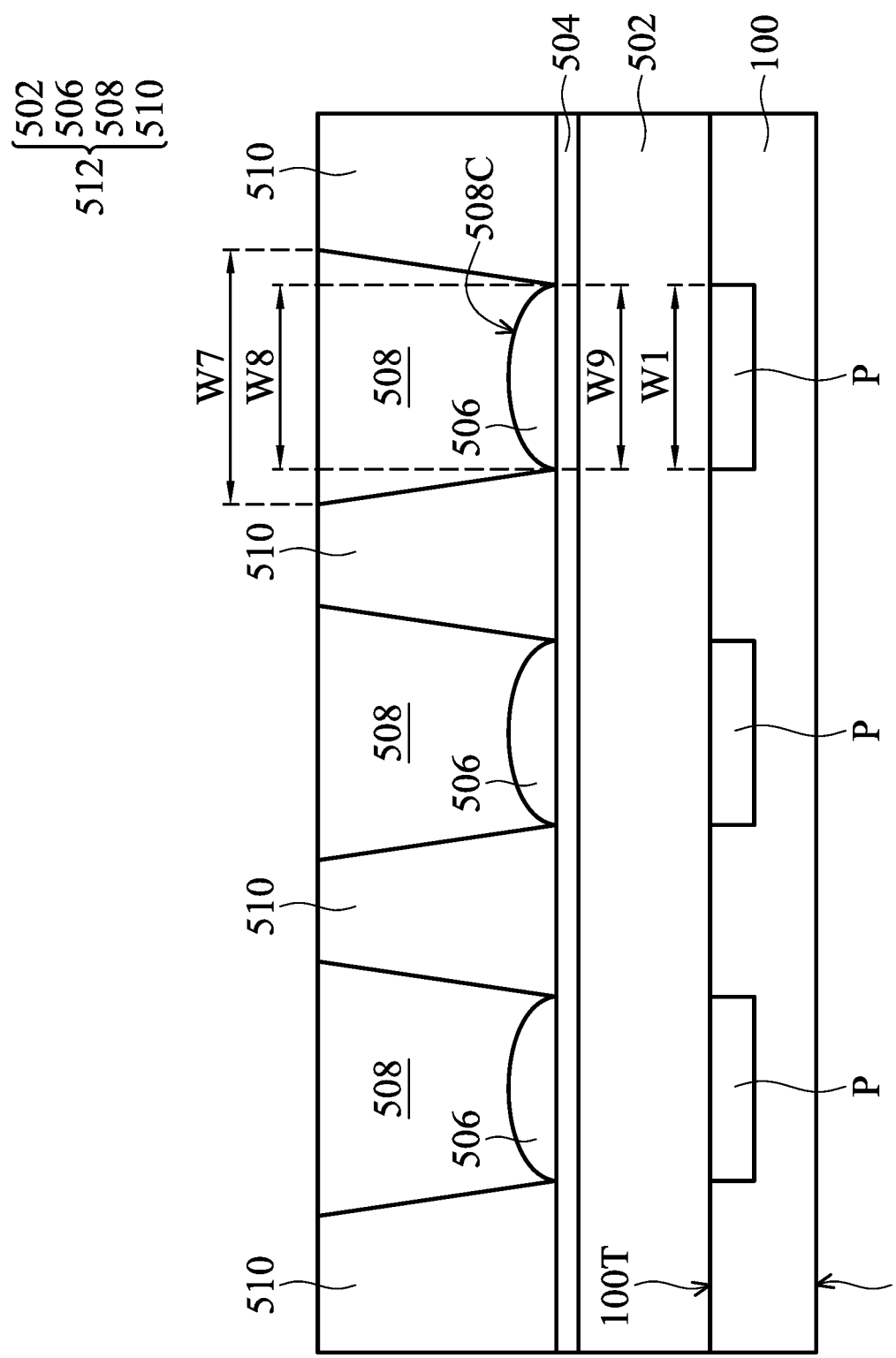
FIG. 7 is a cross-sectional diagram illustrating a semiconductor device according to some embodiments of the present disclosure.

FIG. 7 is a cross-sectional diagram illustrating a semiconductor device 70 according to some embodiments of the present disclosure. A difference between the semiconductor device 70 and the semiconductor device 50 is that the top width W7 of the transparent pillar 508 of the light collimator layer 512 of the semiconductor device 70 is greater than bottom width W8. In some embodiments, as shown in FIG. 7, the bottom width W8 of the transparent pillar 508 is substantially equal to the bottom width W9 of the optical microlens 506.

In summary, the light collimator layer of the semiconductor device of the embodiment of the invention includes a plurality of optical microlenses. The optical microlenses may enhance the collimation performance of the light collimator layer. Moreover, in some embodiments, since the optical microlenses are disposed in the light collimator layer, the transparent pillars of the light collimator layer may have a smaller aspect ratio, thereby avoiding or alleviating the collapse of the transparent pillars.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate, wherein the substrate comprises a plurality of pixels; and
   a light collimator layer disposed on the substrate;
   wherein the light collimator layer comprises:
      a light shielding layer disposed on the substrate;
      a plurality of transparent pillars disposed on the light shielding layer, wherein the transparent pillars cover the pixels, and the transparent pillars have a regular trapezoid shape, wherein a longer side of parallel sides of the regular trapezoid shape is adjacent to a corresponding one of the pixels; and
   a plurality of optical microlenses disposed on the pixels.

2. The semiconductor device as claimed in claim 1, wherein the transparent pillars are located between the optical microlenses and the pixels.

3. The semiconductor device as claimed in claim 1, wherein the transparent pillars are formed of a first material, the optical microlenses are formed of a second material, and the first material is different from the second material.

4. The semiconductor device as claimed in claim 3, wherein a refractive index of the optical microlenses is greater than a refractive index of the transparent pillars.

5. The semiconductor device as claimed in claim 3, wherein the transparent material layer is formed of the first material disposed between the transparent pillars.

6. The semiconductor device as claimed in claim 1, wherein the optical microlenses are located between the transparent pillars and the pixels.

7. The semiconductor device as claimed in claim 1, wherein a vertical projection of the optical microlenses on the substrate are located in a vertical projection of the light shielding layer on the substrate.

8. The semiconductor device as claimed in claim 6, wherein the transparent pillars are in direct contact with top surfaces of the optical microlenses.

9. The semiconductor device as claimed in claim 8, wherein the transparent pillars have concave bottom profiles.

10. The semiconductor device as claimed in claim 6, wherein the transparent pillars are formed of a first material, the optical microlenses are formed of a second material, and the first material is different from the second material.

11. The semiconductor device as claimed in claim 10, further comprising a transparent material layer disposed between the optical microlenses and the substrate.

12. A method for forming the semiconductor device of claim 1, comprising:
   providing a substrate, wherein the substrate comprises a plurality of pixels;
   forming a plurality of transparent pillars on the pixels, wherein the transparent pillars have a regular trapezoid shape, wherein a longer side of parallel sides of the regular trapezoid shape is adjacent to a corresponding one of the pixels;
   forming a light shielding layer on the substrate, wherein the light shielding layer surrounds the transparent pillars; and
   forming a plurality of optical microlenses on the pixels.

13. The method for forming a semiconductor device as claimed in claim 12, before the step of forming the transparent pillars, further comprising:
   forming a transparent material layer on the substrate, wherein the transparent pillars are formed on the transparent material layer.

14. The method for forming a semiconductor device as claimed in claim 12, wherein the optical microlenses are formed after the step of forming the transparent pillars, and the optical microlenses are formed on the transparent pillars.

15. The method for forming a semiconductor device as claimed in claim 12, wherein the optical microlenses are formed before the step of forming the transparent pillars, and the transparent pillars are formed on the optical microlenses.

16. The method for forming a semiconductor device as claimed in claim 15, wherein the light shielding layer surrounds the optical microlenses.

17. The method for forming a semiconductor device as claimed in claim 15, wherein the transparent pillars are in direct contact with the top surfaces of the optical microlenses, and the transparent pillars have concave bottom profiles.

18. The semiconductor device as claimed in claim 1, further comprising an adhesive layer disposed between the transparent pillars and the optical microlenses, wherein one of the optical microlenses has a convex surface and a flat surface and the flat surface is in direct contact with the adhesive layer.

19. The semiconductor device as claimed in claim 1, wherein an aspect ratio of one of the transparent pillars is 5:1 to 1:2.

20. The semiconductor device as claimed in claim 4, the refractive index of the optical microlenses is 1.2 to 1.8, and the refractive index of the transparent pillars is 1.0 to 1.5.

* * * * *